April 14, 1970 K. LANGROD 3,506,498

THERMOELECTRIC DEVICE INCLUDING CONDUCTIVE GRANULES FOR OBTAINING LOW RESISTANCE BONDS

Original Filed Oct. 28, 1963

INVENTOR.
KASIMIR LANGROD
BY Henry Kolin
ATTORNEY

United States Patent Office 3,506,498
Patented Apr. 14, 1970

3,506,498
THERMOELECTRIC DEVICE INCLUDING CONDUCTIVE GRANULES FOR OBTAINING LOW RESISTANCE BONDS

Kasimir Langrod, Sherman Oaks, Calif., assignor to North American Rockwell Corporation, a corporation of Delaware Original application Oct. 28, 1963, Ser. No. 319,300, now Patent No. 3,372,469, dated Mar. 12, 1968. Divided and this application Sept. 27, 1967, Ser. No. 687,938
Int. Cl. H01v 1/18
U.S. Cl. 136—237 6 Claims

ABSTRACT OF THE DISCLOSURE

A thermoelectric device for generating electric current including a telluride thermoelectric body bonded to a conductive body of material. A barrier layer is disposed between the two bodies, and conductive granules penetrate this barrier to bond together the two bodies and form low-resistance conductive paths between them through the barrier layer.

Figure 1:
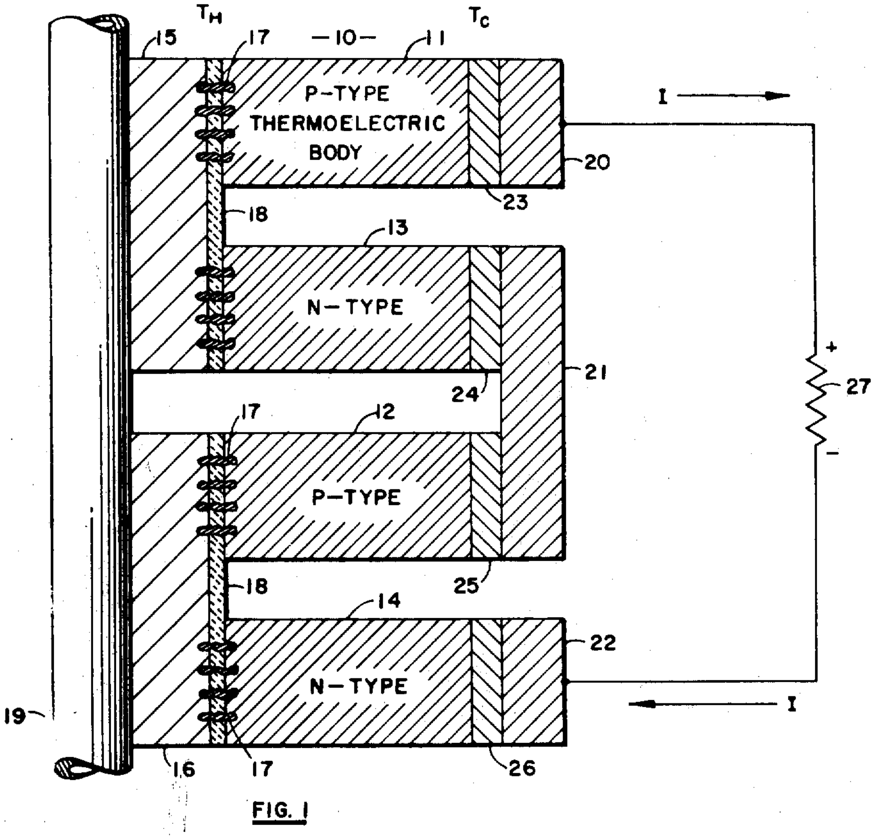

This is a division of application Ser. No. 319,300, filed Oct. 28, 1963, now Patent No. 3,372,469.

This invention relates to improved thermoelectric devices and to methods of fabricating such devices. More particularly, the invention relates to improved materials and methods for obtaining mechanically strong, thermally stable, low-resistance contacts to thermoelectric bodies. Still more particularly, the invention relates to a method for bonding aluminum to lead telluride.

Thermoelectric components or circuit members are made of semiconducting bodies of thermoelectric materials such as lead telluride, bismuth telluride, antimony telluride, germanium telluride, silver indium telluride, silver gallium telluride, copper gallium telluride, silver antimony telluride, sodium mangaese telluride, and the like. Similar compounds of selenium, for example silver antimony selenide, and of sulfur, for example the rare earth sulfides, also exhibit thermoelectric effects. Such compounds containing at least one member of the group consisting of sulfur, selenium, and tellurium are generally known as chalcogenides. While the pure compounds may be utilized, thermoelectric compositions usually consist of alloys of more than one compound. Small amounts of various additives or doping agents may be incorporated in the thermoelectric composition to modify the conductivity type of the material.

Thermoelectric devices which convert heat energy directly into electric energy do so by means of the Seebeck effect. That is, when heat is applied to one junction of a thermoelectric device, while the other junction is cooled, an electrical potential is produced proportional to the thermoelectric power of the thermoelements employed and to the temperature difference between the junctions.

Generally two thermoelectric circuit members or components are bonded to a block of metal, which may, for example, be aluminum, copper, or iron, to form a thermoelectric junction. The two members are of thermoelectrically complementary types: one member is made of P-type thermoelectric material and the other of N-type thermoelectric material. Whether a particular thermoelectric material is designated N-type or P-type depends upon the direction of conventional current flow across the cold junction of a thermocouple formed by the thermoelectric material in question and a metal, such as copper or lead, when the thermocouple is operating as a thermoelectric generator according to the Seebeck effect. If conventional current in the external circuit flows from the thermoelectric material, then the material is designated as "P-type"; if the current in the external circuit flows toward the thermoelectric material, then the material is designated as "N-type." The present invention relates to both P-type and N-type thermoelectric materials. Preefrably these materials contain at least 5 weight percent of at least one member of the group consisting of sulfur, selenium, and tellurium. Particularly preferred are the binary and ternary semiconducting alloys of tellurium.

A good thermoelectric material should have a high electrical conductivity and a lower thermal conductivity, since the electromotive force generated in energy converters of this type utilizing the Seebeck effect is dependent upon the temperature difference between the hot and cold junctions. The generation of Joulean heat in the thermoelectric device due to the electrical resistance of either the thermoelectric members, the auxiliary components, or the electrical contacts to the two members will reduce the efficiency of the device.

Heretofore, there has been considerable difficulty in the joining of thermoelectric semiconductor elements into arrays of suitable voltage and power output. This difficulty has been particularly pronounced informing a satisfactory bond between the thermoelectric element and the conductive material at the hot junction, particularly where this hot junction is operated at an elevated temperature such as found in a nuclear reactor. The conductive material to be bonded to the semiconductor material must satisfy a varied set of stringent requirements, namely, low electrical resistivity, high thermal conductivity, thermal expansivity closely matching that of the semiconductor, low vapor pressure, melting point well above the maximum operating temperature of the device, and, particularly, chemical and atomic or electronic compatibility with the semiconductor. By chemical compatibility, I refer to the fact that the conductive material and the thermoelement being joined do not form an intermetallic compound of higher resistivity than either material, thereby resulting in a high-resistance contact. By atomic or electronic compatibility, I refer to the fact that the conductive material does not "poison" the semiconductor thermoelement, that is, no deterioration occurs in the thermoelectric power of the thermoelement by the transfer of charge carriers between the thermoelement and the conductive material. For example, a conductive material conterial containing arsenic would ordinarily be unsatisfactory for use with a semiconductor such as germanium telluride because pontavalent arsenic would act as a donor of charge carriers to the germanium, which could deleteriously affect the thermoelectric properties of the germanium telluride.

Because of this multiplicity of varying and often conflicting requirements, it is frequently necessary to match the conductive material and the semiconductor in accordance with the more stringent of the requirements, and compromise with regard to those of secondary importance such as thermal and electrical conductivities. Aside from the melting-point consideration, the fundamental requirements to be met by a satisfactory ohmic bond relate to the chemical and atomic compatibilities, as well as a matching of the coefficients of thermal expansion. These conditions severely restrict the choice of conductive materials for forming a junction with a given semiconductor.

Accordingly, it is an object of the present invention to provide improved thermoelectric devices.

Another object of the invention is to provide improved methods for obtaining mechanically strong, low-resistance electrical connections to thermoelectric bodies.

A further object of the invention is to provide improved methods for obtaining mechanically strong, thermally stable, low-resistance electrical bonds between a thermoelectric body and a metal body.

Still another object of the invention is to permit the utilization of a variety of conductive materials solely on the basis of their thermomechanical and electrical properties without regard to their chemical or atomic compatibility with the semiconductor.

In accordance with the invention, a barrier layer and compatible with both the conductive body and the thermoelectric body and the conductive body. These granules are compatible with both conductive body and the thermoelectric body. Then the facing surfaces of these bodies are contacted under pressure so that the particles or granules of the conductive bonding material penetrate the barrier layer, forming ohmic conductive paths for the conduction of an electric current between the thermoelectric body and the conductive body through the barrier layer. The thermal expansion coefficient of the granules of conductive bonding material need not match those of either the conductive body, the thermoelectric body, or the barrier layer.

Advantageously, by means of the present invention a mechanically strong, low-resistance, thermally stable contact may be made to thermoelectric bodies without regard as to whether the conductive body is chemically or atomically compatible with the thermoelectric body. By means of this technique, a considerable variety of conductive materials may now be utilized for forming mechanically strong, low-resistance bonds with thermoelectric semiconductors. Heretofore, the only means for avoiding chemical or atomic incompatibility between a conductive body and a thermoelectric body, particularly for high temperature contacts, would be to interpose specific brazing alloys between the thermoelectric body and the conductive body to bond these bodies together. However, most known brazing alloys act as poisons for the thermoelectric body, thereby deleteriously affecting its thermoelectric properties, or serve to increase the electrical conductivity of the contact, or are otherwise unsuitable.

It has been found, in accordance with the present invention, that conductive granules are particularly suitable and preferred for bonding a material consisting principally of aluminum, such as pure aluminum or an aluminum alloy, to a lead telluride semiconductor thermoelectric body where an aluminum oxide film has been formed on the aluminum as a barrier layer. Metals such as iron, niobium, and tantalum are illustrative of conductive materials suitable for use as the bonding material. A particularly preferred bonding material is iron, for example, in the form of cast iron.

Figure 2:
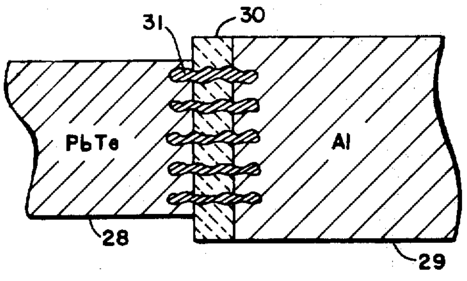

The invention will be described in greater detail by the following examples in conjunction with the accompanying drawings in which:

FIGURE 1 is a cross-sectional view of a thermoelectric Seebeck device comprising a plurality of thermoelectrically complementary thermoelements bonded in series arrangement to metal plates in accordance with a first embodiment of the invention; and FIGURE 2 is a cross-sectional view of a lead telluride thermoelectric body bonded by conductive iron granules to an aluminum body in accordance with a specific and preferred embodiment of the invention.

Referring to FIG. 1, the thermoelectric device 10 comprises thermoelectric bodies 11 and 12, which may, as illustrated, be P-type and complementary type thermoelectric bodies 13 and 14, which in this example are N-type, as illustrated in the drawing. While various thermoelectric bodies may be used in accordance with this invention, preferably each thermoelectric body comprises at least 5 weight percent of at least one member of the group consisting of sulfur, selenium, and tellurium. It will be understood that the conductivity types of thermoelectric bodies 11 and 12 and those of 13 and 14 may be reversed. One end of thermoelectric bodies 11 and 13 and one end of bodies 12 and 14, which pairs are of opposite conductivity type, are bonded respectively to conductive bodies 15 and 16, which preferably are metal plates of aluminum, copper, or stainless steel. Inasmuch as conductive bodies 15 and 16 need not be chemically or atomically compatible with the thermoelectric bodies, because of the manner of bonding in accordance with this invention, these metal plates are selected primarily on the basis of having a melting point above that of the temperature of operation of the thermoelectric device, a suitable thermal conductivity, and a thermal coefficient of expansion closely matching that of the thermoelectric bodies. Accordingly, any of various metals or alloys may be used for conductive bodies 15 and 16 provided they are also chemically compatible with conductive granules 17, which are used to bond the thermoelectric bodies to the conductive bodies.

Conductive granules 17 are selected on the basis of the following characteristics. The granules must form low resistance contacts with conductive bodies 15 and 16; that is, the granules must be chemically compatible with these conductive bodies. The formation of high-resistivity intermetallic compounds must be avoided. This may be readily determined experimentaly or by reference to binary alloy phase diagrams. Similarly, and similarly determinable, conductive granules 17 must be chemically and electronically compatible with thermoelectric bodies 11–14. Thus, depending on the particular semiconductor used for the thermoelectric bodies, the conductive granules will be selected accordingly so as not to provide donor or acceptor charge carriers which will deleteriously affect the semiconducting properties of the thermoelectric bodies. This may be readily determined experimentally or by reference to the known art relating to the effect of impurities and doping agents on semiconductors.

The conductive granules are hard particulate materials having a melting point above that of the operating temperature of the thermoelectric device. Selection may be made from the various high-melting refractory metals and alloys, depending on the particular thermoelectric and conductive bodies being joined. The granules may be of regular shape, such as spherical shot, or may be irregularly shaped. Suitably, the granules will be between 10 and 400 mesh, U.S. Standard Sieve particle size, and preferably between 30 and 50 mesh in size. The granular particles are of sufficient hardness to penetrate barrier layers 18, which are either genetically derived from conductive bodies 15 and 16 or constitute an artificial barrier layer interposed between the conductive and thermoelectric bodies. By the term "genetically derived" I refer to layers, coatings, or films formed on a surface of the conductive body by chemical reaction with the material comprising this body. Thus, where conductive bodies 15 and 16 are plates of pure aluminum or an aluminum alloy, a genetically derived thin aluminum oxide coating will be rapidly formed on the surfaces of the aluminum, particularly at elevated temperatures under oxidizing conditions. The granules will penetrate this layer to form an ohmic contact between the aluminum plate and the thermoelectric body. Similarly, a passivated iron oxide film may be genetically formed where the metal plates are of iron. Alternatively, a vitreous, adhering material such as titanium silicide may be deposited on conductive bodies 15 and 16 to form barrier layers 18.

The barrier layer is essentially a high resistance layer which prevents the movement of charge carriers therethrough or chemical interaction between the thermoelectric and conductive bodies. Its presence allows for forming stable bonds between conductive bodies and thermoelectric bodies which may be chemically or atomically incompatible, without the occurrence of electronic deterioration of the thermoelectric bodies or the formation of high-resistance contacts between the thermoelectric and conductive bodies. While the thickness of the barrier layer is not critical per se, the layer must, of course, be penetrable by the conductive granules. Films varying in thickness between a few tenths of a mil and several hundred mils are contemplated.

In the operation of thermoelectric device 10, conductive bodies 15 and 16 are heated to a temperature $T_H$ and become the hot junction of the device. Where the thermoelectric device 10 is used to convert heat given off in a nuclear reactor to electrical energy, the heat source from a nuclear reactor cooled by liquid sodium may be the liquid sodium flowing through electrically insulated pipe 10. Metal plates 20, 21, and 22, which respectively contact one end of thermoelectric bodies 11, 12–13, and 14, are maintained at a cold junction temperature $T_c$, which is lower than the temperature $T_H$ of the hot junction of the device.

In the embodiment shown in FIG. 1, it is assumed that the cold junction temperature is below 180° C., and therefore metal plates 20, 21, and 22 are shown as being connected to the thermoelectric bodies by the use of the ordinary soft solder of commerce, namely the lead-tin eutectic, which melts at about 180° C. Where the lower or cold junction temperature is below 180° C., for example at room temperature, this soft solder will form an adequate low-conductivity bond. It is, of course, assumed that the solder bonds 23, 24, 25, and 26, which serve to bond the metal plates to the thermoelectric bodies, are chemically and electronically compatible with the materials being joined. At the cold junction, problems of compatibility and matching of thermal expansion are ordinarily much less severe and critical than those present at the hot junction. Further, it should be understood that the bonding method of this invention used for joining the thermoelectric and conductive bodies for the hot junction may equally well be utilized for the cold junction bonding.

A temperature gradient is thus established in each of thermoelements 11–14 from a high temperature adjacent plates 15 and 16 to a low temperature adjacent plates 20, 21, and 22. The electromotive force developed under these conditions produces in the external circuit a flow of conventional current I in the directions shown by arrows in FIG. 1; that is, the current flows in the external circuit from the P-type thermoelement 11 toward the N-type thermoelement 14, through a load shown as a resistance 27 in the drawing.

EXAMPLE 1

The present invention may be utilized in its preferred aspects to provide a particularly desirable mechanically strong, low-resistance electrical bond between lead telluride and aluminum. Referring to FIG. 2, a body of lead telluride is shown as a semiconductor thermoelement. Lead telluride has properties which make it particularly attractive for use as a thermoelectric element. It has a relatively low thermal conductivity, which gives a high temperature differential between the hot and cold junctions. Its electrical resistivity can be low enough to permit high current flow with low potential. Slight departures from stoichiometry do not adversely affect these electrical and thermal characteristics. Lead telluride can be doped readily with lead iodide to form a negative (N-type) material or with sodium metal to form a positive (P-type) material. By arranging the positive and negative elements in couples and connecting the couples in series, as shown in FIG. 1, the potential voltages obtainable can be increased to a useful value.

On the other hand, lead telluride presents problems in fabrication into useful shapes in that it has relatively low tensile and compressive strengths and a very high coefficient of thermal expansion. These properties, together with its low thermal conductivity, make the material very susceptible to rupture from mechanical and thermal shock. Typical properties of lead telluride are shown below in Table 1.

TABLE 1

Physical Properties of Lead Telluride

| | |
|---|---|
| Density (g./cc.) | 8.25 |
| Coefficient of thermal expansion (° C.) | $10\times10^{-6}$ |
| Compressive strength (p.s.i.) | 10,000 |
| Tensile strength (p.s.i.) | 1,000 |
| Young's modulus (p.s.i.) | $2\times10^{6}$ |
| Thermal conductivity (w./cm.—° C): | |
| N | 0.024 |
| P | 0.019 |
| Electrical resistivity (75° F.) (microhms/in.) | |
| N | 112 |
| P | 192 |

A conductive body of aluminum 29 would appear attractive as an end cap material for lead telluride thermoelectric elements because the thermal expansion of aluminum closely matches that of lead telluride, it has a low density making for lightweight units, and it has excellent thermal and electrical conductives. Also, because the hot junction temperature that may be employed is close to that of the melting point of aluminum, the ensuing semiplastic resilient state of the aluminum tends to have a cushioning effect on the lead telluride elements, protecting them against rupture. However, the presence of a thin aluminum oxide film 30, which readily forms on the aluminum surface, results in a high contact resistance. Further, conventional welding techniques for joining the aluminum and lead telluuride, involving the use of fluxes and high-temperature brazing alloys, result in degradation of the electrical properties of the junction.

In accordance with the invention, it was found that a low-resistance non-degradative contact could be formed between the aluminum 29 and the lead telluride 28 by first embedding in the aluminum body iron granules 31, ranging in size preferably from 50 to 30 mesh, by cold pressing these granules (cast iron, 3% C.) at approximately 3,000–4,000 p.s.i. against the aluminum disks to pierce the oxide film 30 present and give a highly satisfactory mechanical and electrical bond to the aluminum. On hot pressing these iron-containing aluminum end caps against lead telluride pellets (P-type) at 3,000 to 4,000 p.s.i. at a temperature of 1100–1200° F. for 5 to 10 minutes, P-type elements of low resistance were obtained, as shown in Table II below:

TABLE II.—RESISTANCE OF P-TYPE LEAD TELLURIDE ELEMENTS WITH IRON-IMPREGNATED ALUMINUM END CAPS

| Sample No. | Resistance (microhms) | |
|---|---|---|
| | Before hot pressing | After hot pressing |
| 1 | 99 | 220 |
| 2 | 119 | 210 |
| 3 | 131 | 232 |
| 4 | 123 | 255 |

Bismuth telluride is a useful and efficient thermoelectric material, closely resembling lead telluride in many of its thermoelectric and physical properties, and may be used in place of lead telluride in the foregoing example. When bismuth telluride ($Bi_2Te_3$) is employed as a P-type thermoelectric material, thermal electromotive forces of +100 to +180 mv./° C. and resisitivities as low as .0008 to .0012 ohm-cm. are obtained. In addition, the deviation from the Wiedemann-Franz-Lorenz ideal for thermoelectric materials is less than 2.7 (or a W.-F.-L. number of $6.615\times10^{-8}$ volts²/deg. C.); this means that P-type bismuth telluride has an extremely low thermal conductivity. N-type bismuth telluride has a thermal electromotive force of −170 to −200 mv./° C. and a resistivity of .0008 to .0006 ohm-cm.; its deviation from the W.-F.-L. ideal is less than 3 or a W.-F.-L. number of $7.35\times10^{8}$ volts²/deg. C.

EXAMPLE 2

Standard iron-capped thermoelements were prepared by hot-press runs in which iron disks were pressed against lead telluride pellets in graphite dies using optimum hot-pressing parameters of 5,000 p.s.i., 1550° F. and 30 minutes.

Aluminum end caps were bonded to lead telluride elements in accordance with this invention, iron particles being first cold pressed into the aluminum disks, and then these disks being hot pressed at optimum conditions of 4,000 p.s.i., 1150° F. and 5–10 minutes. Heat cycling tests were conducted comparing the standard iron-capped elements with the aluminum-capped ones. The results obtained are shown in Table III.

TABLE III.—ELECTRICAL RESISTANCE OF P-TYPE LEAD TELLURIDE ELEMENTS, BEFORE AND AFTER THERMAL CYCLING

| Type of Element | Resistance (microhms) (average of 7 specimens) | |
|---|---|---|
| | Before cycling | After 1 cycle to 1,000° F. and 3 cycles to 1,000° F. |
| Standard iron-capped | 245 | 460 |
| Aluminum-capped (4,000 p.s.i.) | 204 | 312 |

While granules of iron, in the form of cast iron, are particularly preferred for joining a conductive body of aluminum to a thermoelectric body of lead telluride, or similar binary telluride such as bismuth telluride, granules of other conductive materials, such as metals of suitable melting point which are non-degradative of the properties of the thermoelectric element and of the conductive body, may also be used. Thus, other conductive metals showing suitable properties for use in practicing the invention include molybdenum, titanium, vanadium, niobium, tantalum, manganese, and cerium. While granules of iron are eminently suitable for use in the practice of this invention, other group VIII metals of the Periodic Table of Elements, forming the so-called transition element triads, generally yield inferior results, although varying somewhat among one another. Thus, the group VIII metals, with the exception of iron, i.e., cobalt, nickel ruthenium, rhodium, palladium, osmium, iridium, and platinum would not give as suitable results in the practice of this invention because of the degradation that occurs.

The process of the present invention is readily adaptable to commercial production. For example, lead telluride pellets, 0.500″ in diameter by 0.170″ long may be prepared on a production basis in accordance with this invention by using hot-pressing techniques with 5-layer, 12-cavity graphite dies, 60 capped pellets being obtained with each pressing operation. Preferably, an inert atmosphere such as argon is present during the hot-pressing operation to prevent oxidation of the pellets. The number of dies used is determined in part by the size of the press and the length of the furnace. In general, the pellets and metal contacts with prior-embedded granules are loaded into the die cavity, and graphite spacers are used to separate the element assemblies from each other. Pressure is transmitted to the pellets by the use of graphite plungers. A Nichrome-wound resistance furnace on a hydraulic press is suitable. Optimally, a pressure of 4,000 p.s.i. at a temperature between 1100 and 1200° F. for 5 to 10 minutes is used for the hot-pressing, but this may be varied depending on the number of layers and cavities employed and the furnace characteristics.

It will be understood that the embodiments described above are by way of example only, and are not intended as limitations on the invention. Various modifications and variations may be made without departing from the spirit and scope of the instant invention. For example, while the term "conductive body" has been illustrated by the use of pure metals and metallic alloys, the term will also be applicable to low-resistivity semiconductor materials. That is, in accordance with the process of this invention, two semiconductor bodies may be bonded together by the use of conductive granules.

Similarly, when reference is made to aluminum, the aluminum alloys in which aluminum is a predominant component are also contemplated, including techniques of aluminum powder metallurgy; in place of copper, any of the well known brasses of commerce may be used. The term "iron" includes iron alloys, for example, the cast and wrought irons and stainless steels. Cast iron, containing approximately 3% carbon, is a harder material than unalloyed iron, and will more readily penetrate an insulating film such as aluminum oxide.

It will be understood that chemical instability or incompatibility may occur in other forms than those previously mentioned. For example, the electrode material may alloy with the thermo-element in a eutectic reaction which lowers the melting point of the alloyed layer; or the conductive electrode material may diffuse into the thermo-element forming second phase highly conductive material which causes local short circuiting of the thermoelement; or the electrode material may react directly with the thermoelectric material to destroy its molecular form; or the electrode material may dissolve the doping agent to effectively leach it out of the thermoelement. Similarly, with respect to electronic compatibility, it is important that the electrode material not fuse into the thermoelement to form donor or acceptor sites which alter the local carrier concentration.

The relative stability of the semiconductor thermoelement material and of the conductive granules may be determined by referring to thermochemical data. Where the reaction between the semiconductor and the conductive granules is characterized by a negative free energy change (as given by the Gibbs-Helmholtz equation), the reaction tends to proceed with a release of energy so that the conductive granules ordinarily are not stable with respect to the semiconductor material. Where the free energy change for the reaction of the semiconductor with the conductive granules is zero or positive, the reaction will not proceed and the conductive granules may be considered to be stable in contact with the semiconductor.

Where thermochemical data are lacking, the relative stability of the conductive granules in contact with the thermoelement may be ascertained experimentally by annealing the combination at a temperature greater than the maximum temperature to be encountered in the application. After the annealing, a recheck of the electrical characteristics will indicate whether the conductive granules have reacted with the thermoelement to change its electrical characteristics. Metallographic examination of a sectioned semiconductor-metallic element interface will indicate whether significant interdiffusion exists. Similar techniques may be used to determine whether significant interaction between the conductive granules and the conductive body may occur.

It should be noted that the thermal expansivity of the conductive granules need not match that of the conductive and thermoelectric materials. For example, if the thermal expansivity of the conductive granules is less than that of the conductive and thermoelectric materials, and the temperature at which the junction is formed is higher than the device operating temperature, residual compressive stresses set up around each penetrating granule may well enhance the mechanical and electrical integrity of the bond formed.

Genetically derived barrier layers have been shown as formed on the surface of the conductive materials; for example, barrier layers 18 are shown as coextensive with the surfaces of conductive bodies 15 and 16. However, it should be understood that the barrier layers may also be derived from the thermoelectric bodies. Most of the thermoelements of practical utility today form thin surface oxide layers immediately upon exposure to air. Heretofore these thermoelements have had to be treated to remove such oxides before a good contact could be formed. However, with respect to the present invention, oxide layers formed on the surfaces of the thermoelements may also serve as barrier layers. Thus, there may be barrier layers present on either or both of the surfaces of the conductive and thermoelectric bodies.

While the particulate granules are preferably first embedded in the conductive metal plate by cold pressing, followed by hot pressing against the plate with the thermoelement, other methods of practicing the invention may be used. For example, the conductive granules may be hot pressed into the surface of the metal plate. Or the conductive granules may be cold pressed or hot pressed directly into the surface of the thermoelement. Alternatively, the barrier layer and the granules may be disposed between the thermoelectric body and the conductive body, and all may be joined together in a single operation by hot pressing the entire assemblage. Other variations will equally well suggest themselves to those skilled in this art. Accordingly, the scope of the invention is to be limited only in accordance with the objects and claims thereof.

I claim:

1. A thermoelectric device comprising a thermoelectric body bonded to a conductive body with a barrier layer therebetween, the material bonding said bodies consisting essentially of conductive granules penetrating said barrier layer thereby forming low-resistance conductive paths between said bodies through said barrier layer.

2. A thermoelectric device according to claim 1 wherein the barrier layer is genetically derived from the conductive body.

3. A thermoelectric device according to claim 1 wherein the conductive granules are selected from the class consisting of iron, molybdenum, titanium, vanadium, niobium, tantalum, manganese, and cerium.

4. A thermoelectric device according to claim 1 wherein the conductive granules consist principally of iron.

5. A thermoelectric device comprising a thermoelectric body consisting essentially of a telluride semiconductor bonded to a conductive body of aluminum with a barrier layer therebetween of aluminum oxide genetically derived from the aluminum body, the material bonding said bodies consisting essentially of conductive granules penetrating said barrier layer thereby forming low-resistance conductive paths between said bodies through said barrier layer.

6. A thermoelectric device comprising a thermoelectric body of lead telluride bonded to a conductive body of aluminum having a genetically derived aluminum oxide barrier layer therebetween, the material bonding said bodies consisting essentially of conductive granules penetrating said barrier layer thereby of iron forming low-resistance conductive paths between said bodies through said barrier layer.

References Cited

UNITED STATES PATENTS

| | | | |
|---|---|---|---|
| 2,627,649 | 2/1953 | Matthysse | 136—201 |
| 3,048,643 | 8/1962 | Winchler et al. | 136—201 |
| 3,080,261 | 3/1963 | Fritts et al. | 136—201 X |
| 3,082,277 | 3/1963 | Lane et al. | 136—237 |

ALLEN B. CURTIS, Primary Examiner